(12) United States Patent
Hsu et al.

(10) Patent No.: US 12,033,947 B2
(45) Date of Patent: Jul. 9, 2024

(54) SEMICONDUCTOR PACKAGE STRUCTURE AND METHOD FOR FORMING THE SAME

(71) Applicant: TAIWAN SEMICONDUCTOR MANUFACTURING COMPANY, LTD., Hsinchu (TW)

(72) Inventors: Chia-Kuei Hsu, Hsinchu (TW); Ming-Chih Yew, Hsinchu (TW); Shu-Shen Yeh, Taoyuan (TW); Po-Yao Lin, Zhudong Township, Hsinchu County (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 610 days.

(21) Appl. No.: 17/231,310

(22) Filed: Apr. 15, 2021

(65) Prior Publication Data

US 2022/0336359 A1  Oct. 20, 2022

(51) Int. Cl.
*H01L 23/538* (2006.01)
*H01L 21/768* (2006.01)

(52) U.S. Cl.
CPC .... *H01L 23/5384* (2013.01); *H01L 21/76801* (2013.01); *H01L 23/5385* (2013.01); *H01L 23/5386* (2013.01)

(58) Field of Classification Search
CPC ........... H01L 23/5384; H01L 21/76801; H01L 23/5385; H01L 23/5386
See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |

(Continued)

FOREIGN PATENT DOCUMENTS

| TW | 202002181 A | 1/2020 |
|---|---|---|
| TW | 202111882 A | 3/2021 |

*Primary Examiner* — Fernando L Toledo
*Assistant Examiner* — Neil R Prasad
(74) *Attorney, Agent, or Firm* — Birch, Stewart, Kolasch & Birch, LLP

(57) ABSTRACT

A semiconductor package structure includes a first bottom electrical connector, an interposer over the first bottom electrical connector, and a first top electrical connector over the first top via structures. The interposer includes first bottom via structures in contact with the first bottom electrical connector. The interposer also includes a first trace of a first redistribution layer structure over the first bottom via structures. The interposer also includes first via structures over the first redistribution layer. The interposer also includes a first trace of a second redistribution layer structure over the first via structures. The interposer also includes second via structures over the second redistribution layer structure. The first bottom via structures, the first via structures, and the second via structures are separated from each other in a top view.

20 Claims, 25 Drawing Sheets

(56) References Cited

U.S. PATENT DOCUMENTS

| | | | |
|---|---|---|---|
| 9,372,206 B2 | 6/2016 | Wu et al. | |
| 9,496,189 B2 | 11/2016 | Yu et al. | |
| 2012/0267776 A1* | 10/2012 | Nin | H01L 23/522 |
| | | | 257/737 |
| 2013/0214855 A1* | 8/2013 | Foster, Sr. | H01L 25/0657 |
| | | | 257/774 |
| 2014/0268614 A1* | 9/2014 | Zhang | H01L 21/768 |
| | | | 174/262 |
| 2015/0145147 A1* | 5/2015 | Chi | H01L 25/0652 |
| | | | 257/777 |
| 2021/0233897 A1* | 7/2021 | Jang | H01L 21/78 |

* cited by examiner

SEMICONDUCTOR PACKAGE STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

A chip package not only provides protection for semiconductor devices from environmental contaminants, but also provides a connection interface for the semiconductor devices packaged therein. Smaller package structures, which utilize less area or are lower in height, have been developed to package the semiconductor devices.

New packaging technologies have been developed to further improve the density and functionalities of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1-2 is an enlarged cross-sectional view of a semiconductor package structure, in accordance with some embodiments of the disclosure.

FIG. 2 is an enlarged top view of a semiconductor package structure, in accordance with some embodiments of the disclosure.

DETAILED DESCRIPTION

Figure 1:
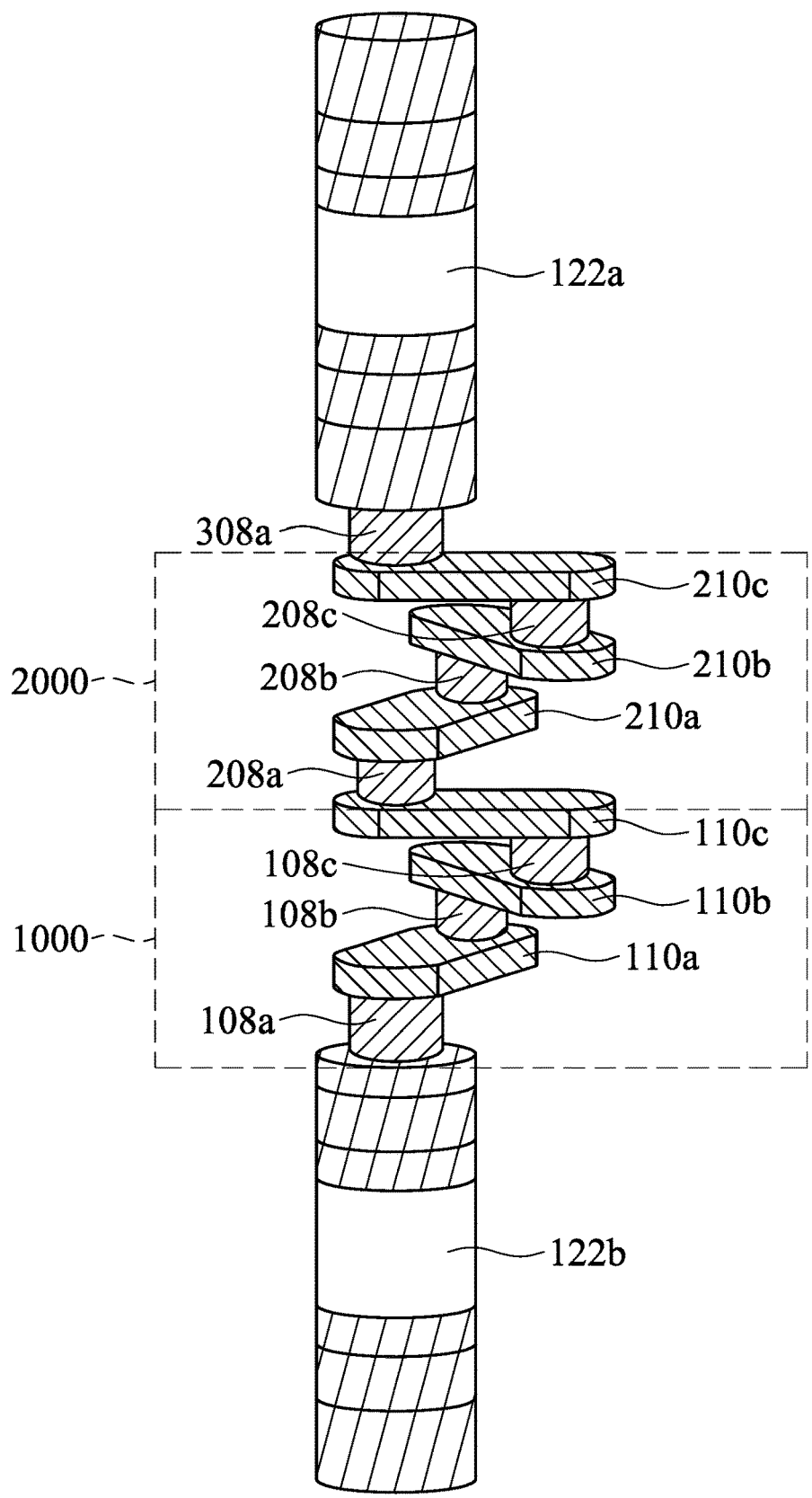
FIG. 1-1 is an enlarged perspective view of a semiconductor package structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Herein, the terms "around," "about," "substantial" usually mean within 20% of a given value or range, and better within 10%, 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Embodiments for forming a semiconductor package structure are provided. The method includes forming an interposer with redistribution layer structures in adjacent via layers extending in different directions. The via structure connecting the traces of the redistribution layer structures are therefore in different cross-sectional views. Therefore, the effect of coefficient of thermal expansion (CTE) mismatch between the device and the substrate may be reduced, and the strain the via structure suffered may be further reduced. The flexibility and the reliability window may be also improved.

FIG. 1-1 is an enlarged perspective view of a semiconductor package structure 10a, in accordance with some embodiments of the disclosure. Two conductive units 1000 and 2000 may be formed between electrical connectors 122a and 122b.

In some embodiments, the conductive unit 1000 includes multiple redistribution layer structures 110a, 110b, and 110c, and via structures 108a, 108b, and 108c. The via structure 108a may be formed between the electrical connectors 122b and the redistribution layer structure 110a. The via structure 108b may be formed between the redistribution layer structure 110a and the redistribution layer structure 110b. The via structure 108c may be formed between the redistribution layer structure 110b and the redistribution layer structure 110c.

In some embodiments, the conductive unit 2000 includes multiple redistribution layer structures 210a, 210b, and 210c, and via structures 208a, 208b, and 208c. The via structure 208a may be formed between the conductive unit 1000 and the redistribution layer structure 210a. The via structure 208b may be formed between the redistribution layer structure 210a and the redistribution layer structure 210b. The via structure 208c may be formed between the redistribution layer structure 210b and the redistribution layer structure 210c.

In some embodiments, a trace of the redistribution layer structure 110a and a trace of the redistribution layer structure 110b intersect with each other from a top view. In some embodiments, the redistribution layer structure 110a and the redistribution layer structure 110b partially overlap from a top view. In some embodiments, the extending direction of a trace of the redistribution layer structure 110a and the extending direction of a trace of the redistribution layer structure 110b are different. In some embodiments, the trace of the redistribution layer structure 110a extends from a side of the trace of the redistribution layer structure 110b to the opposite side of the trace of the redistribution layer structure 110b and protrudes from the opposite side of the trace of the redistribution layer structure 110b.

In some embodiments, the via structure 108a is separate from the via structure 108b and the via structure 108c from a top view. Therefore, the deformation induced by coefficient of thermal expansion mismatch between the device/die and the substrate may be reduced, and the strain transmitted to via structures may be further reduced. In addition, the reliability window may also be improved.

In some embodiments, the via structures 208a/208b/208c and the redistribution layer structure 210a/210b/210c in the conductive unit 2000 are arranged in the same way as the via structures 108a/108b/108c and the redistribution layer structure 110a/110b/110c in the conductive unit 1000. In some embodiments, a trace of the redistribution layer structure 210a and a trace of the redistribution layer structure 210b intersect with each other from a top view. In some embodiments, the via structure 208a is separate from the via structure 208b and the via structure 208c from a top view. In some embodiments, the conductive unit 1000 and the conductive unit 2000 are repeated conductive units.

In some embodiments, a via structure 308a is formed between the conductive units 2000 and the electrical connectors 122a. The via structure 308a may be vertically aligned with the via structures 108a and 208a, but is not limited thereto. It should be noted that, the number of conductive units shown in FIG. 1-1 is merely an example, and the present disclosure is not limited thereto, depending on the demands of the application.

Figures 1, 2:
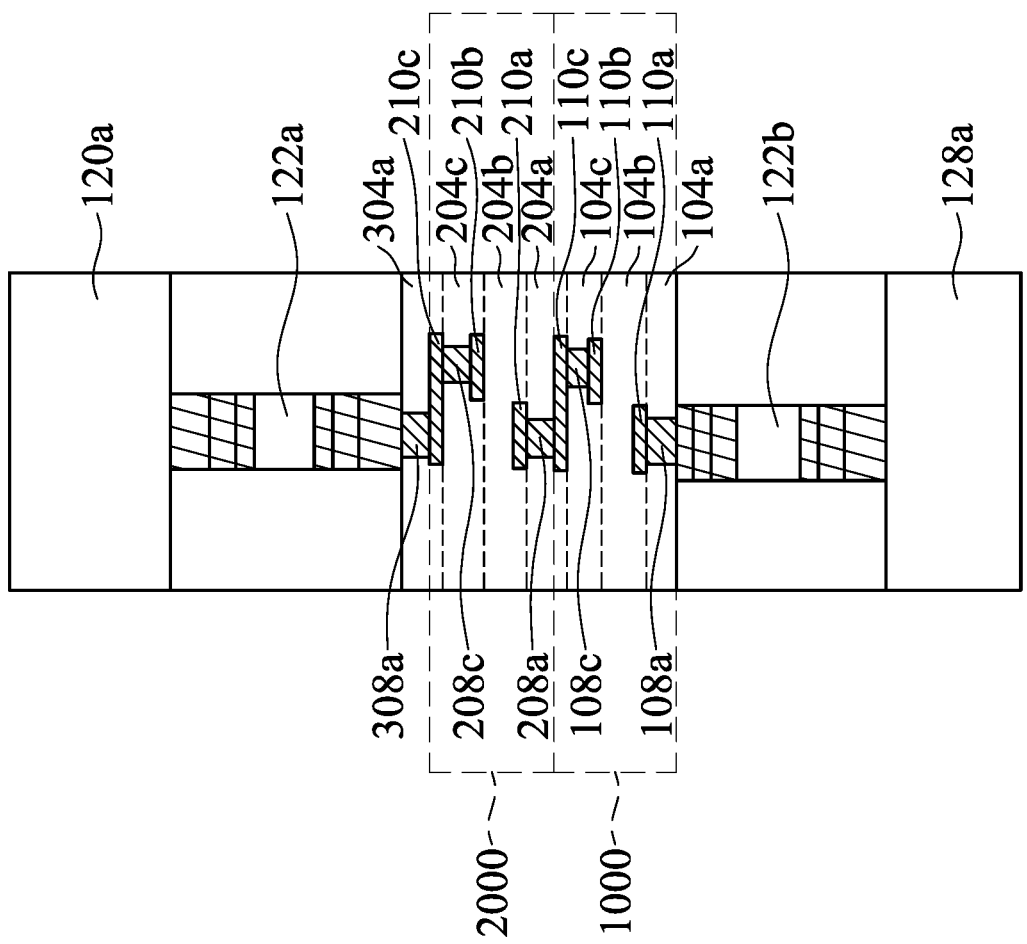
Figure 2:
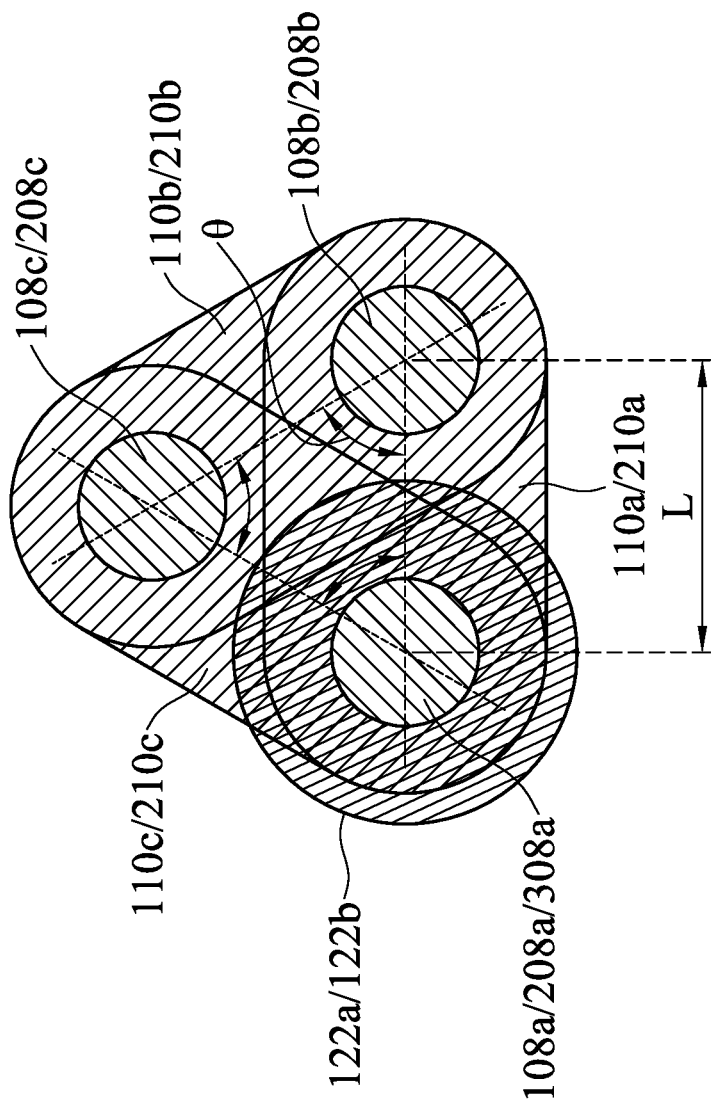

FIG. 1-2 is an enlarged cross-sectional view of a semiconductor package structure, in accordance with some embodiments of the disclosure. In some embodiments, since the trace of adjacent redistribution layer structures are extending in different directions, the via structures in different via layers are in different cross-sectional views. In some embodiments as shown in FIG. 1-2, a trace of the redistribution layer structure 110a and a trace of the redistribution layer structure 110b are separated by a dielectric layer 104b.

FIG. 2 is an enlarged top view of a semiconductor package structure, in accordance with some embodiments of the disclosure. In some embodiments, FIG. 2 is a top view of the via structures and the redistribution layer structures as shown in FIG. 1-1. In some embodiments, since the conductive units 1000 and 2000 are repeatedly arranged, the via structure 108a overlaps the via structures 208a and 308a. Moreover, the via structures 108b and 108c may overlap the via structures 208b and 208c, respectively. In addition, the traces of redistribution layer structures 110a, 110b, and 110c may overlap the traces of redistribution layer structures 210a, 210b, and 210c, respectively. In some embodiments as shown in FIG. 2, the traces of redistribution layer structures 110a, 110b, and 110c are arranged in the shape of a triangle from a top view. The traces of redistribution layer structures 210a, 210b, and 210c may be also arranged in the shape of a triangle from the top view.

In some embodiments, the angle θ between the extending direction of the trace of the redistribution layer structures 110a and the extending direction of the trace of the redistribution layer structures 110b is in a range of about 30° to about 150'. If the angle θ is too less or too great, the coefficient of thermal expansion mismatch between the device/die formed above the conductive units and the substrate formed below the conductive units may be worse. In some embodiments, the distance L between the center of the via structures 108a/208a/308a and the center the via structures 108b/208b is greater than about 3 μm. If the distance L is too short, the coefficient of thermal expansion mismatch between the device/die and the substrate may be worse.

Figure 3A:
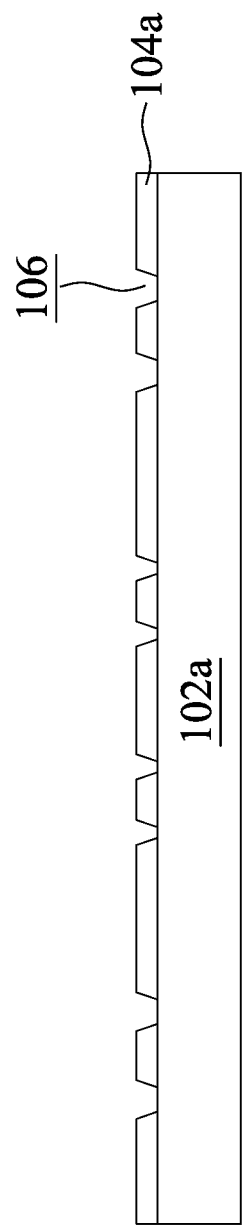
FIGS. 3A-3Q are cross-sectional representations of various stages of forming a semiconductor package structure, in accordance with some embodiments of the disclosure.
Figure 3B:
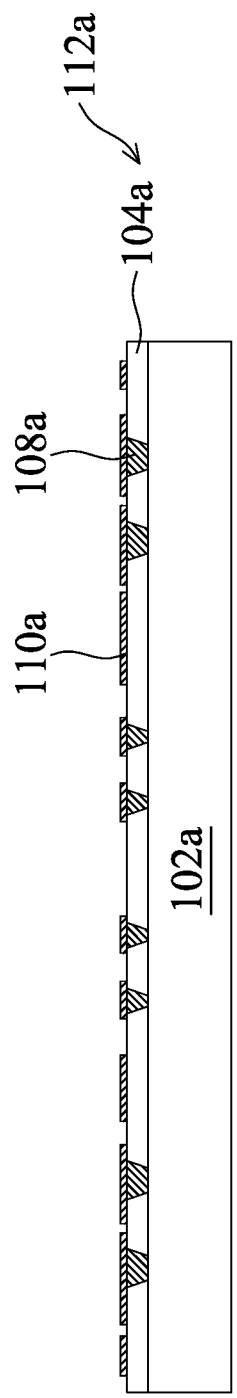
Figure 3C:
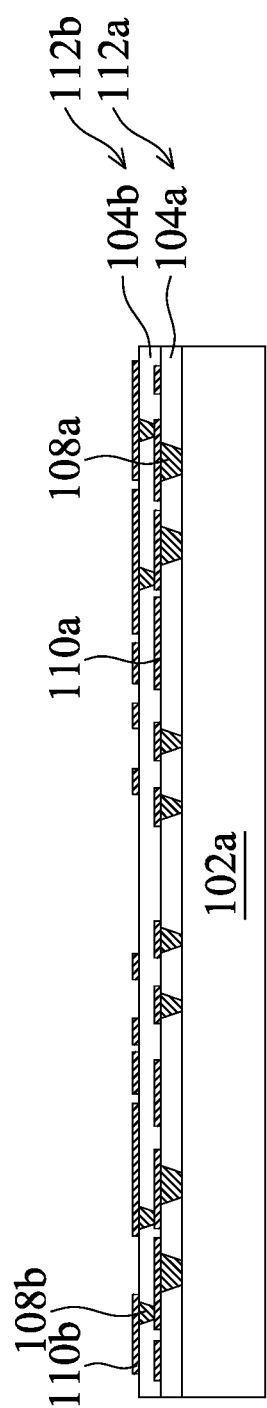
Figure 3D:
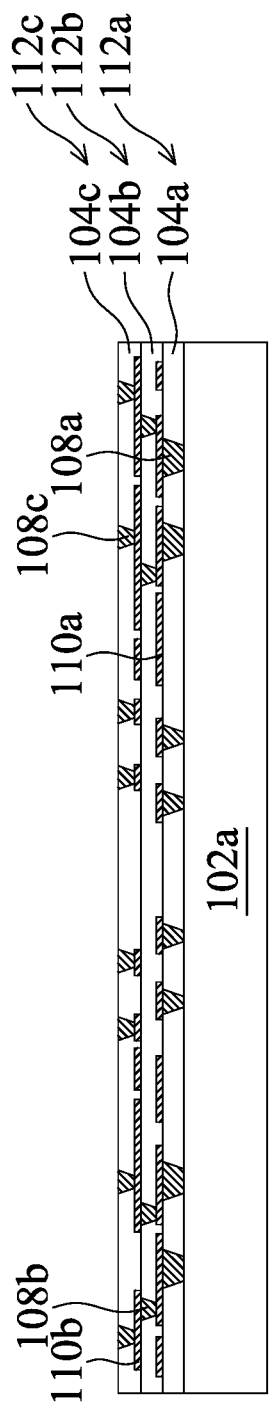
Figure 3E:
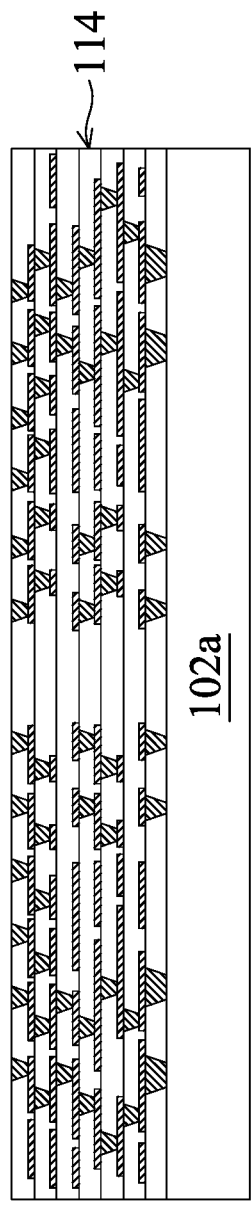
Figure 3F:
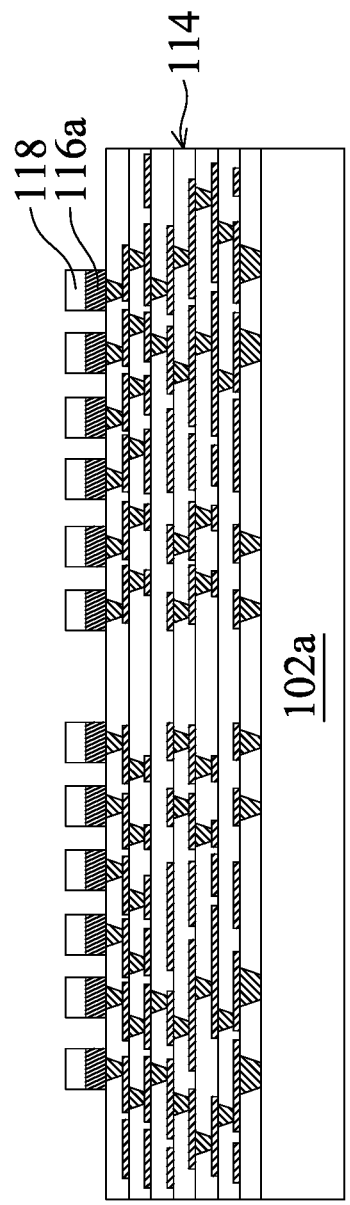
Figure 3G:
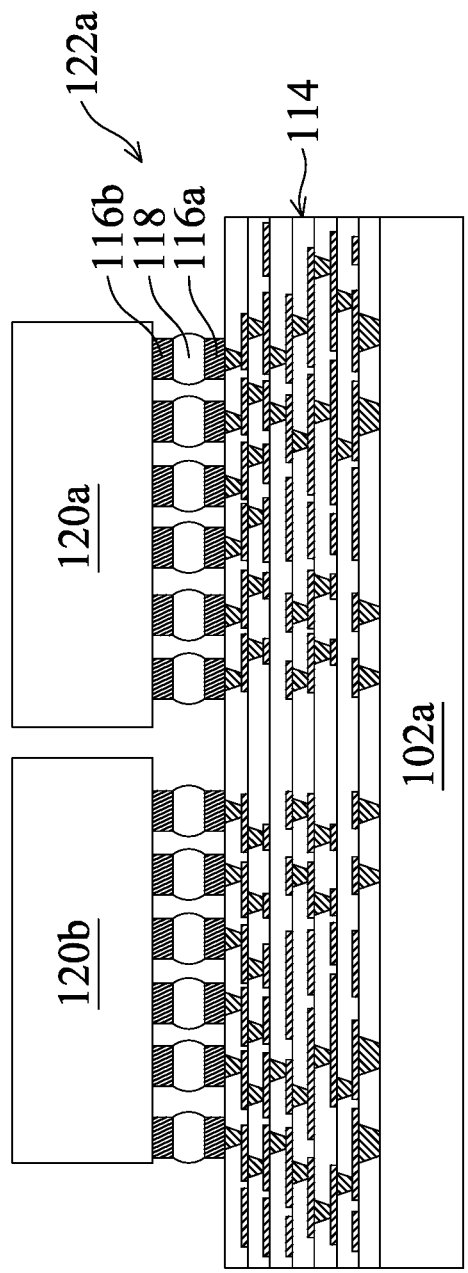
Figure 3H:
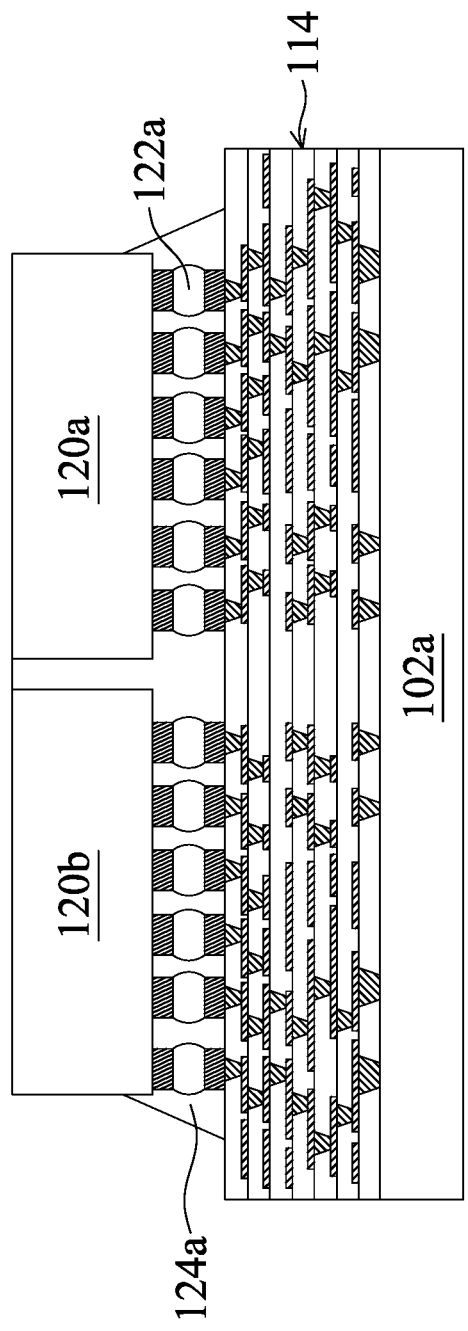
Figure 3I:
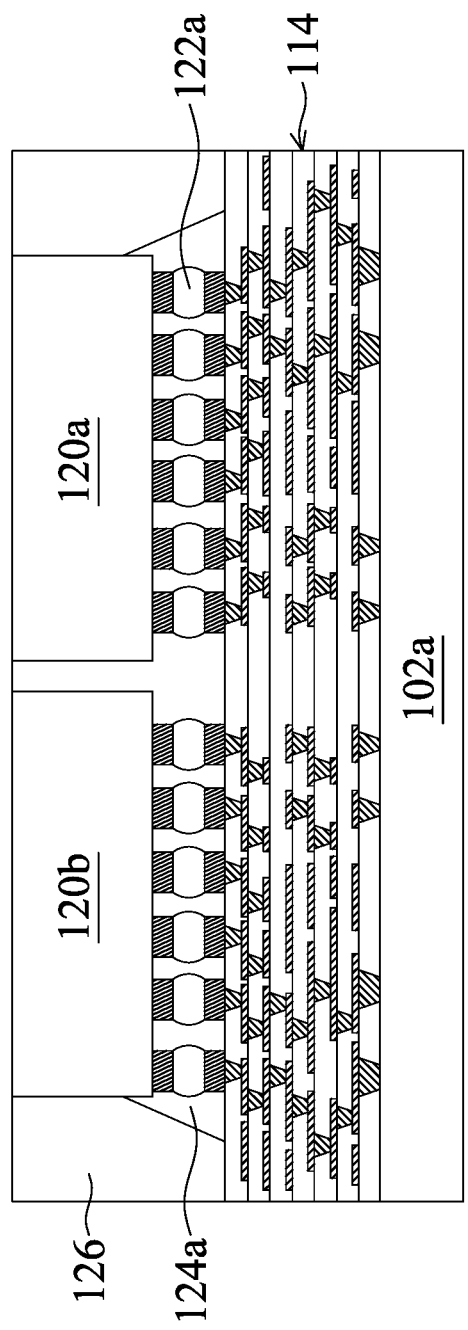
Figure 3J:
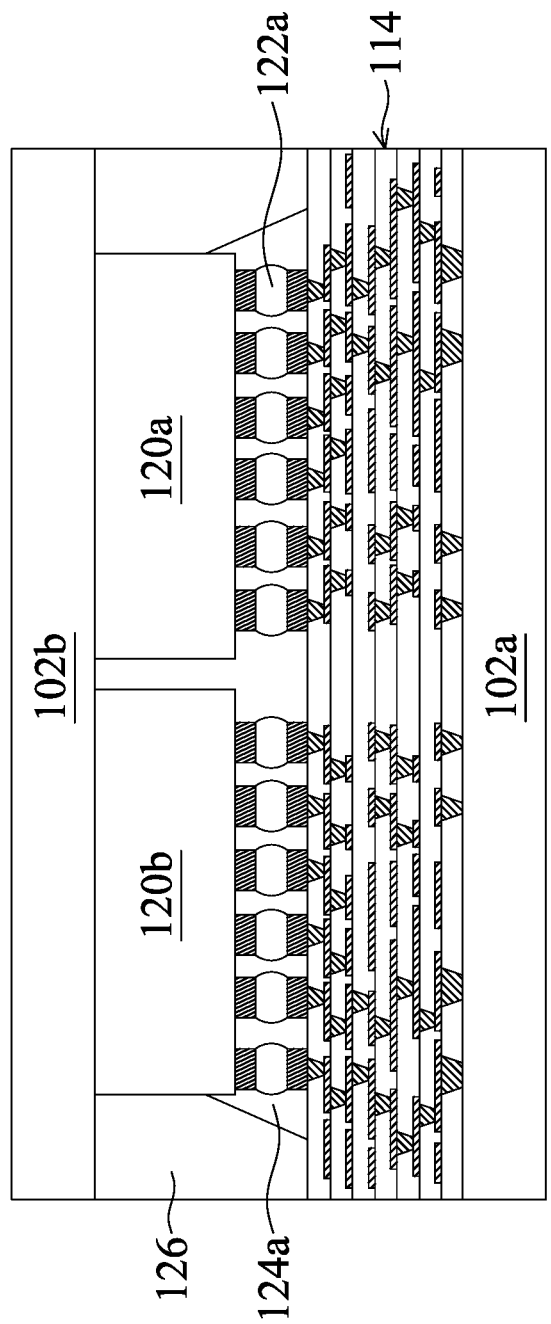
Figure 3K:
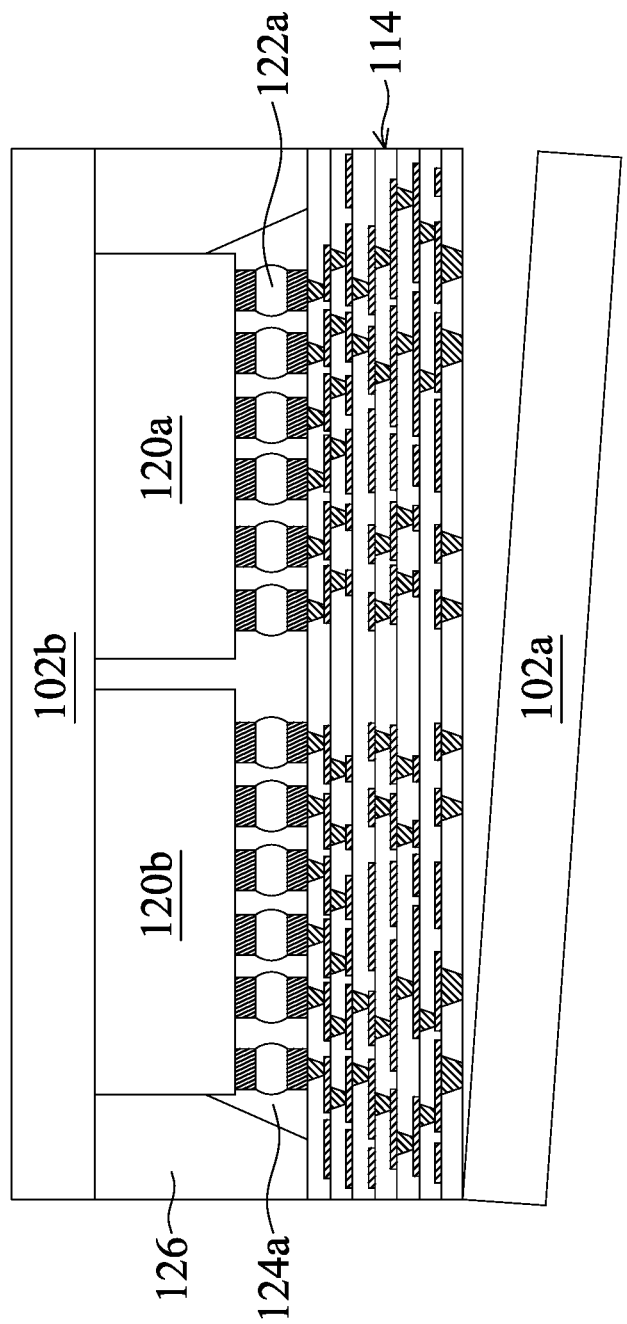
Figure 3L:
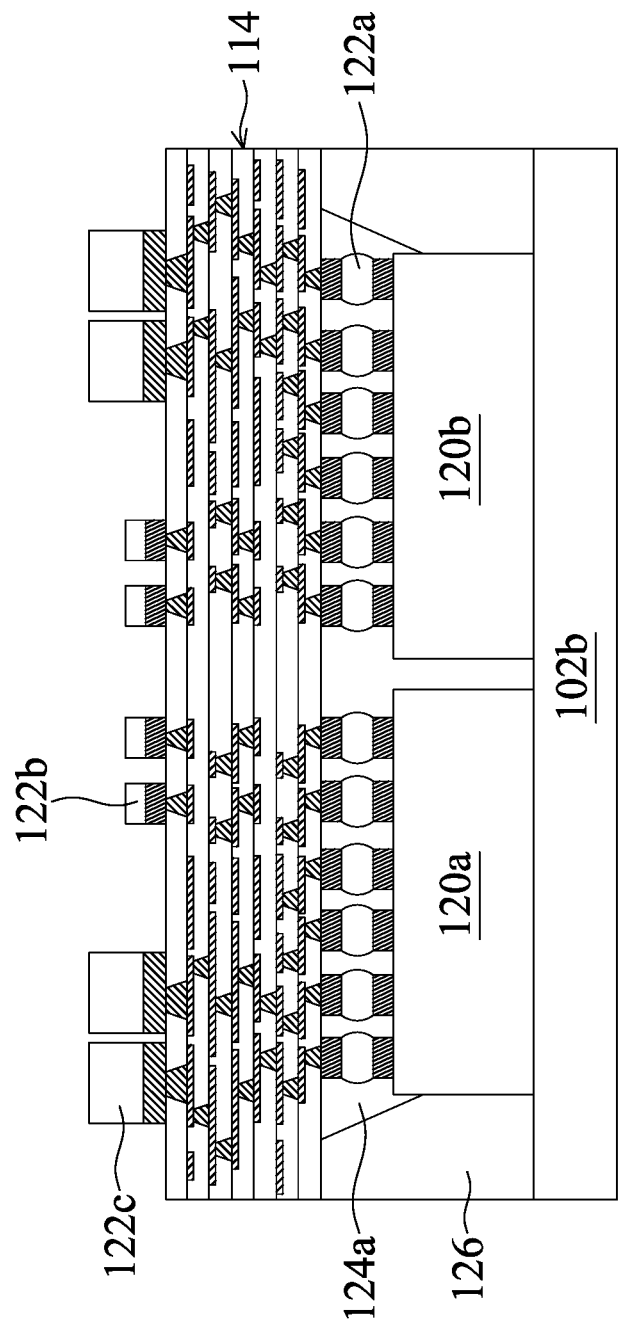
Figure 3M:
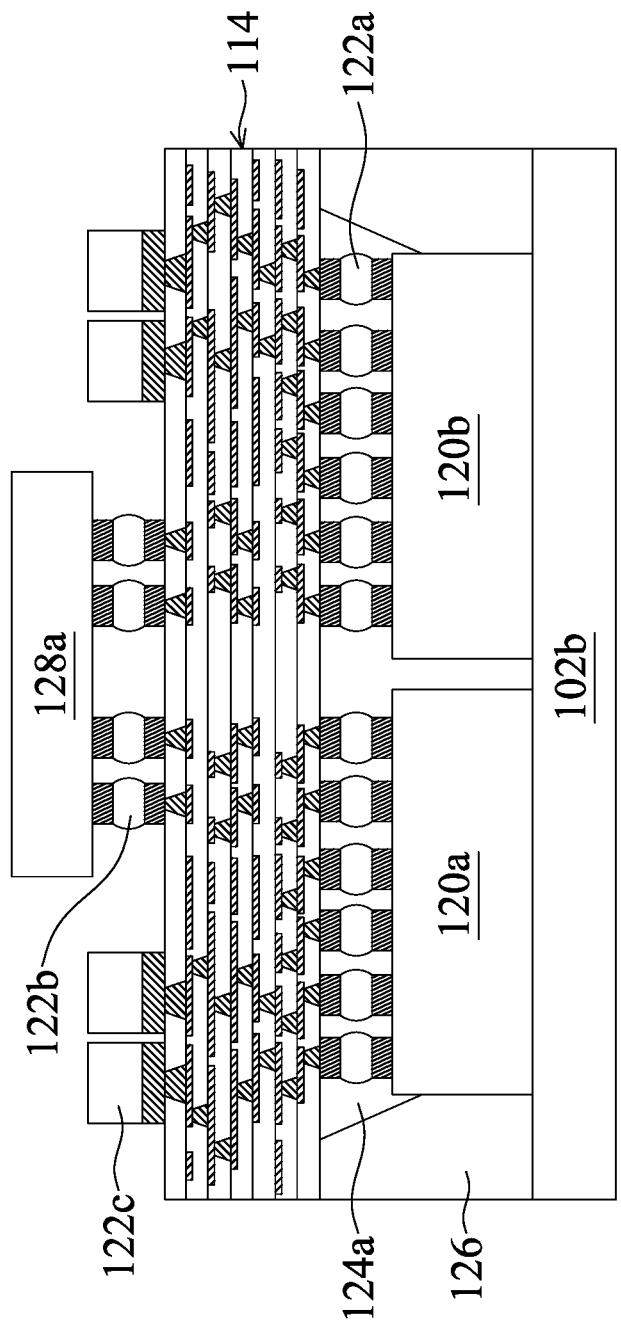
Figure 3N:
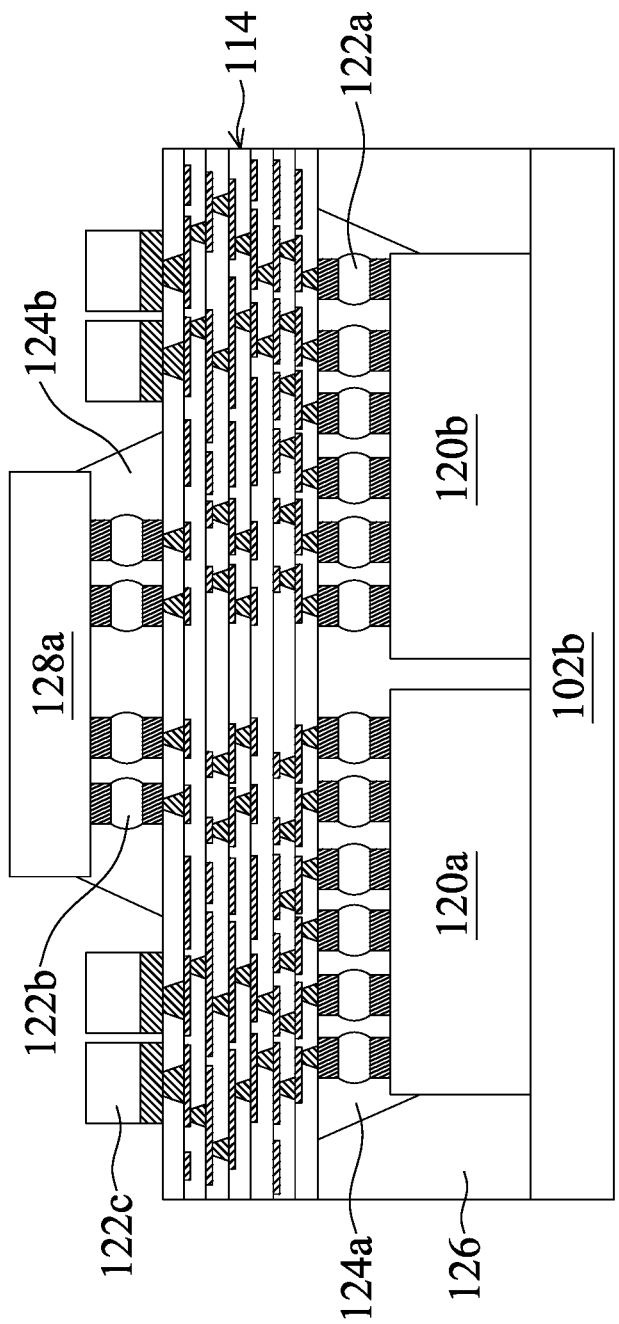
Figure 3O:
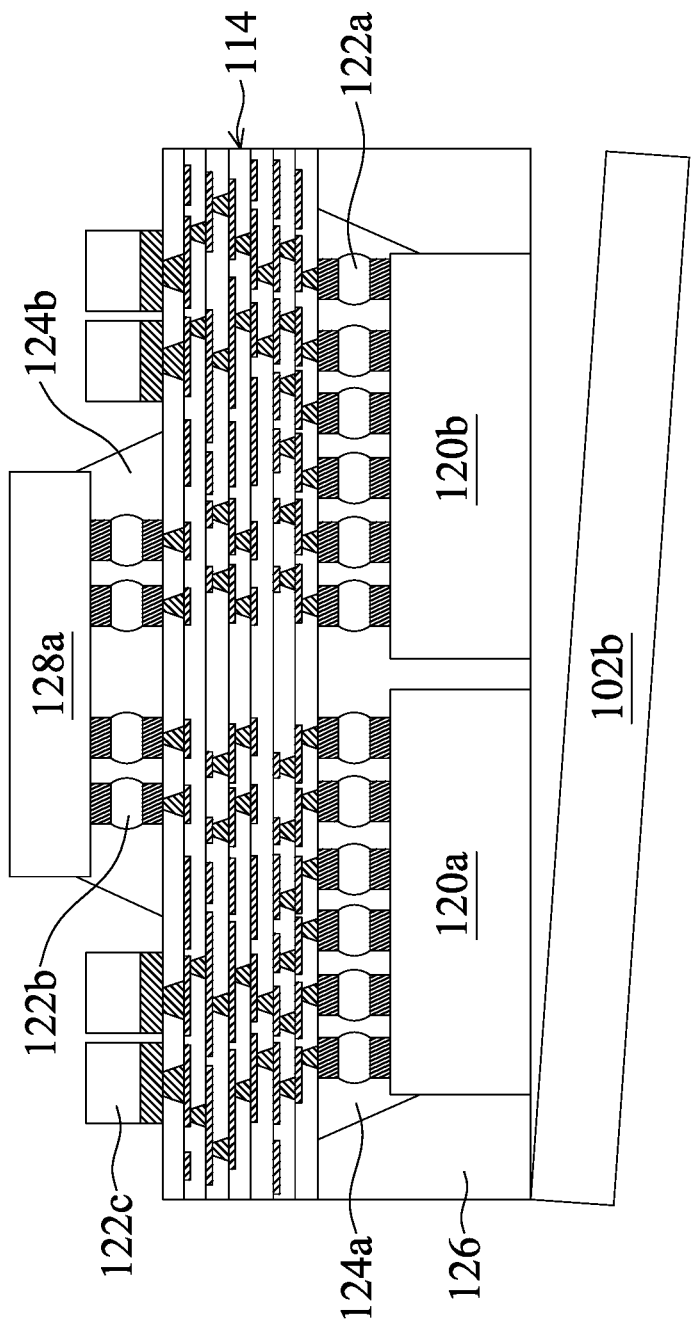
Figure 3P:
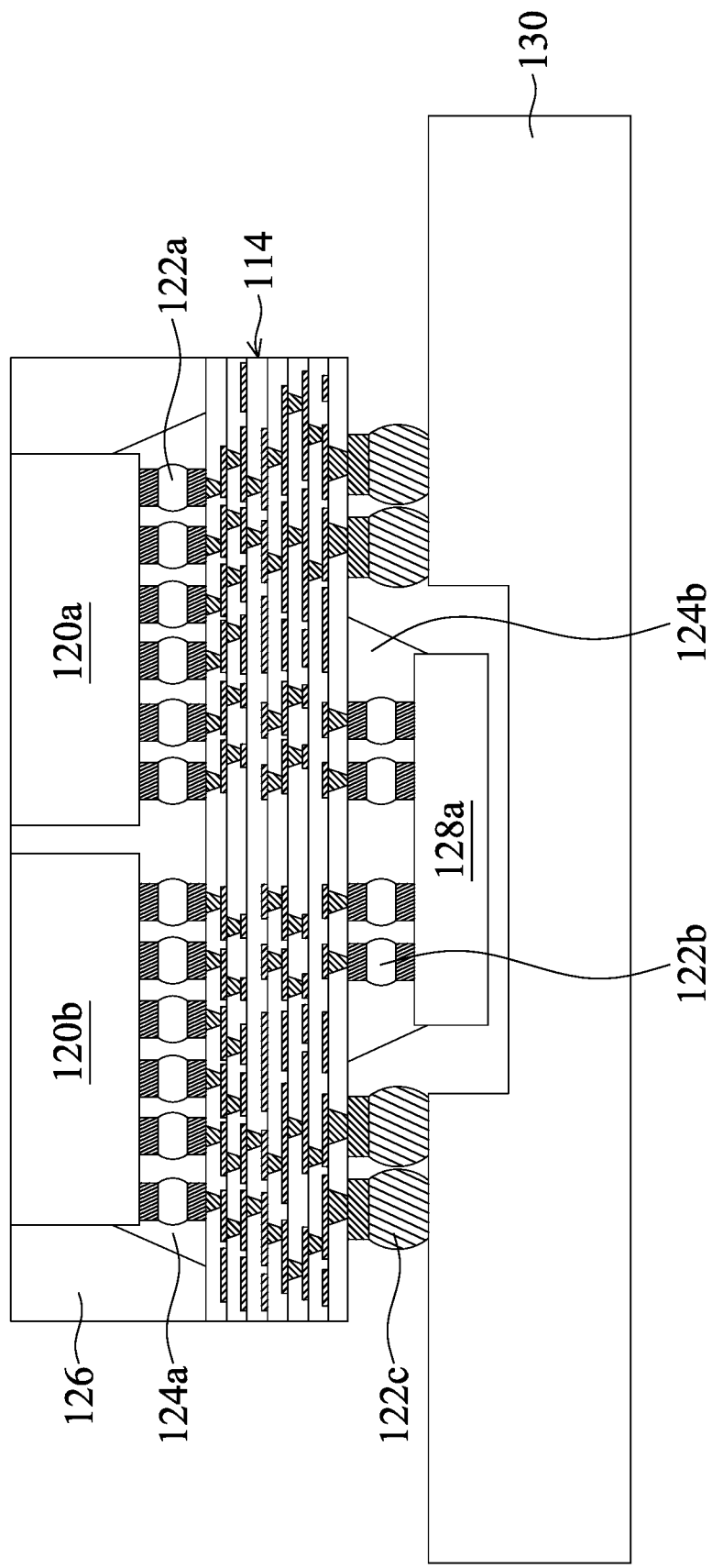
Figure 3Q:
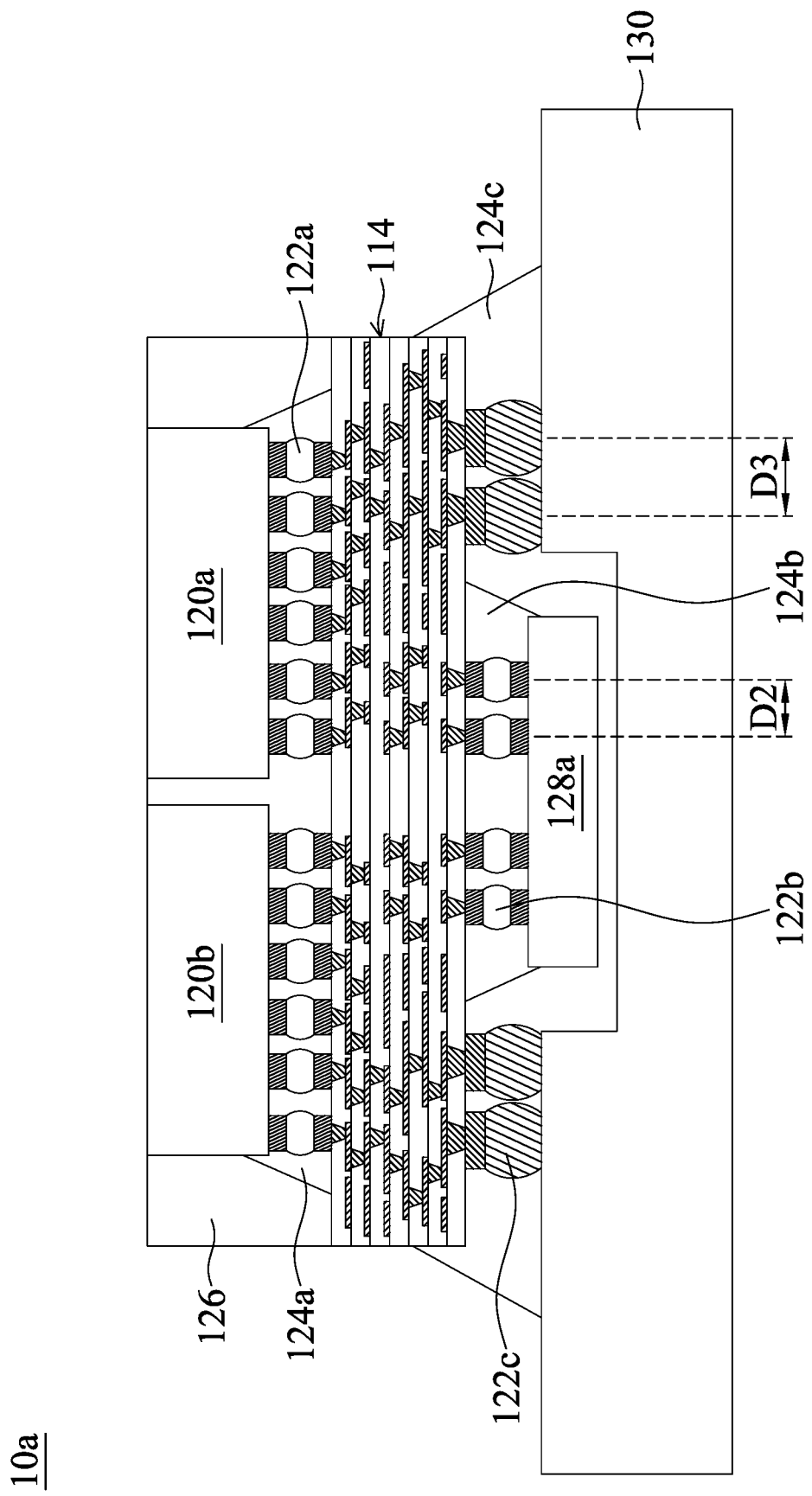

FIGS. 3A-3Q are cross-sectional representations of various stages of forming a semiconductor package structure 10a, in accordance with some embodiments of the disclosure. A first carrier substrate 102a is provided, as shown in FIG. 3A in accordance with some embodiments. The first carrier substrate 102a may provide temporary mechanical and structural support during subsequent processing steps. The first carrier substrate 102a may include glass, silicon, silicon oxide, aluminum oxide, metal, the like, or a combination thereof. The first carrier substrate 102a may include a metal frame.

Next, an adhesive layer may be formed over the first carrier substrate 102a (not shown). The adhesive layer may be made of glue or foil. The adhesive layer may be made of a photosensitive material which is easily detached from the first carrier substrate 102a by light irradiation. The adhesive layer may be made of a heat-sensitive material.

Afterwards, a buffer layer may be formed over the adhesive layer (not shown). The buffer layer may be a polymer-based layer. The buffer layer may be made of a poly-p-phenylenebenzobisthiazole (PBO) layer, a polyimide (PI) layer, a solder resist (SR) layer, an Ajinomoto buildup film (ABF), a die attach film (DAF), other applicable materials, or combinations thereof. The adhesive layer and the buffer layer may be deposited or laminated over the first carrier substrate 102a.

Next, a bottom dielectric layer 104a is formed over the first carrier substrate 102a, as shown in FIG. 3A in accordance with some embodiments of the disclosure. Trenches 106 are formed in the bottom dielectric layer 104a to expose the first carrier substrate 102a or the buffer layer. The bottom dielectric layer 104a may be made of polybenzoxazole (PBO), benzocyclobutene (BCB), silicone, acrylates, siloxane, or combinations thereof. The bottom dielectric layer 104a may be made of non-organic materials, such as silicon oxide, un-doped silicate glass, silicon oxynitride, solder resist (SR), silicon nitride, HMDS (hexamethyldisilazane). The trenches 106 may be formed by photolithography and etching process. The photolithography process may include photoresist coating (e.g. spin-on coating), soft baking, mask aligning, pattern exposure, post-exposure baking, photoresist development, and rinsing and drying (e.g. hard baking), etc. The etching process may include a dry etching process (e.g., reactive ion etching (RIE), anisotropic plasma etching method), a wet etching process, or a combination thereof.

Afterwards, a bottom via structure 108a is formed in the trenches 106 in the bottom dielectric layer 104a, and a first redistribution layer structure (RDL) 110a is formed over the bottom dielectric layer 104a and, as shown in FIG. 3B in accordance with some embodiments of the disclosure. The bottom via structure 108a and the bottom dielectric layer 104a may be referred as the bottom via layer 112a. The bottom via structure 108a and the first redistribution layer structure 110a may be made of metal such as copper (Cu), copper alloy, aluminum (Al), aluminum alloy, tungsten (W), tungsten alloy, titanium (Ti), titanium alloy, tantalum (Ta), or tantalum alloy. The bottom via structure 108a and the first redistribution layer structure 110a may be formed by plating, electroless plating, sputtering or chemical vapor deposition (CVD). In some embodiments, the bottom via structure 108a and the first redistribution layer structure 110a are formed by the same material. In some embodiments, the bottom via structure 108a and the first redistribution layer structure 110a are formed at the same time. In some embodiments, the first redistribution layer structure 126a is made of copper.

Next, a first middle dielectric layer 104b is formed over bottom via layer 112a and the first redistribution layer structure 110a, as shown in FIG. 3C in accordance with some embodiments of the disclosure. Trenches may be formed in the first middle dielectric layer 104b (now shown). Afterwards, a first middle via structure 108b is formed in the trenches in the first middle dielectric layer 104b, and a second redistribution layer structure 110b is formed over the first middle dielectric layer 104b, as shown in FIG. 3C in accordance with some embodiments of the disclosure. The first middle via structure 108b and the first middle dielectric layer 104b may be referred as the first middle via layer 112b. The forming processes and material for forming the first middle dielectric layer 104b, the first middle via structure 108b, and the second redistribution layer structure 110b may be the same as, or similar to, those used when forming the bottom dielectric layer 104a, the bottom via structure 108a, and the first redistribution layer structure 110a, respectively. For the purpose of brevity, the descriptions of these processes and materials are not repeated herein.

Next, a top dielectric layer 104c is formed over the first middle dielectric layer 104b, as shown in FIG. 3D in accordance with some embodiments of the disclosure.

Trenches are formed in the top dielectric layer 104c (now shown). Afterwards, the top via structure 108c is formed in the trenches in the top dielectric layer 104c, as shown in FIG. 3D in accordance with some embodiments of the disclosure. The top via structure 108c and the top dielectric layer 104c may be referred as the top via layer 112c. The forming processes and material for forming the top dielectric layer 104c and the top via structure 108c may be the same as, or similar to, those used when forming the first middle dielectric layer 104b and the first middle via structure 108b, respectively. For the purpose of brevity, the descriptions of these processes and materials are not repeated herein.

As shown in FIG. 3E, the dielectric layers, the via structures, and the redistribution layer structures are repeated formed over the first carrier substrate 102a. In some embodiments, an interposer 114 include multiple via layers and redistribution layer structures are formed over the first carrier substrate 102a. In some embodiments, multiple middle via layers are formed between the bottom via layer 112a and the top via layer 112c. Therefore, multiple redistribution layer structures may be formed over the over the first carrier substrate 102a. It should be noted that, the number of layers of the dielectric layers, the via structures, and the redistribution layer structures shown in FIG. 3E is merely an example, and the present disclosure is not limited thereto.

Next, as shown in FIG. 3F, after the interposer 114 is formed, a micro-bump (ubump) is formed over the interposer 114. First, a conductive layer is formed over the interposer 114 (not shown). The conductive layer may be made of metal material such as aluminum (Al), copper (Cu), tungsten (W), gold (Au), other suitable materials, or a combination thereof. The conductive layer may be deposited by an electroplating process, a sputtering process, another applicable process, or a combination thereof. Afterwards, multiple etching processes may be used to pattern the conductive layer to form conductive pads (not shown).

Next, a passivation layer may be conformally formed over the conductive pads and the interposer 114 (not shown). The passivation layer may be made of polymer material such as polyimide, polybenzoxazole (PBO), benzocyclobutene (BCB), silicone, acrylates, siloxane, other suitable materials, or a combination thereof. The passivation layer may also include non-organic materials such as silicon oxide, un-doped silicate glass, silicon oxynitride, solder resist (SR), silicon nitride, silicon carbide, hexamethyldisilazane (HMDS), other suitable materials, or a combination thereof. The passivation layer may be deposited by a chemical vapor deposition (CVD) process or a spin-on coating process.

Next, the passivation layer may be patterned to form openings exposing the conductive pads (not shown). The openings may be formed by photolithography and etching process. The photolithography process may include photoresist coating (e.g. spin-on coating), soft baking, mask aligning, pattern exposure, post-exposure baking, photoresist development, and rinsing and drying (e.g. hard baking), etc. The etching process may include a dry etching process (e.g., reactive ion etching (RIE), anisotropic plasma etching method), a wet etching process, or a combination thereof.

Next, first conductive pillars 116a are formed in the opening over the conductive pads over the interposer 114, as shown in FIG. 3F in accordance with some embodiments. The first conductive pillars 116a may include copper, nickel, other conductive material, or a combination thereof. The first conductive pillars 116a may formed by an electroplating process, an electroless plating process, a sputtering process, a chemical vapor deposition (CVD) process, the like, or a combination thereof.

A solder element 118 is formed on the first conductive pillars 116a as shown in FIG. 3F in accordance with some embodiments. The solder element 118 may be made of Sn, Ag, Au, other suitable conductive materials, or a combination thereof.

Next, a second conductive pillars 116b are formed under a first semiconductor die 120a and a second semiconductor die 120b, and the first semiconductor die 120a and the second semiconductor die 120b are placed over the conductive pillars 106 over the interposer 114 as shown in FIG. 3G in accordance with some embodiments. The first semiconductor die 120a and the second semiconductor die 120b may be jointed to the interposer 114 by the first conductive pillars 116a, the second conductive pillars 116b, and the solder element 118 between the first conductive pillars 116a and the second conductive pillars 116b. The first semiconductor die 120a and the second semiconductor die 120b may be jointed to the top via layer 112c of the interposer 114. The first conductive pillars 116a, the second conductive pillars 116b, and the solder element 118 may be referred as a first electrical connector 122a, such as the micro-bump (ubump) structure 122a. In some embodiments, the first semiconductor die 120a and the second semiconductor die 120b are mounted over and in contact with the first electrical connector 122a. In some embodiments, the semiconductor dies 120a and 120b are placed over the interposer 114 by a pick-and-place machine process.

In some embodiments, the semiconductor dies 120a/120b are application-specific integrated circuit (ASIC) die, system on integrated circuit (SoIC) die, high bandwidth memory (HBM) die, or the like. In some embodiments, the first semiconductor die 120a and the second semiconductor die 120b are the same with the same function. In some embodiments, the first semiconductor die 120a and the second semiconductor die 120b are different dies with different functions.

It should be noted that the number of the semiconductor dies 120a/120b is merely an example, and the present disclosure is not limited thereto, depending on the demands of the application. In some embodiments, the height of the first semiconductor die 120a and the second semiconductor die 120b are substantially the same. That is, the top surface of the first semiconductor die 120a is level with the top surface of the second semiconductor die 120b. Therefore, it may be easier for subsequently grinding process on the first semiconductor die 120a and the second semiconductor die 120b.

Afterwards, a first underfill layer 124a is filled between the top via layer 112c of the interposer 114 and the semiconductor dies 120a and 120b as shown in FIG. 3H in accordance with some embodiments. In some embodiments, the first underfill layer 124a includes an underfill material, such as epoxy resin, a polymer material, or a filler material. The first underfill layer 124a may provide mechanical support and electrical isolation to the first electrical connector 122a, and protection to the active circuitry from the environment. The first underfill layer 124a may be formed by a capillary flow process. In some embodiments, the first underfill layer 124a has an upwardly tapered trapezoid shapes in a cross-sectional view.

Next, the first underfill layer 124a is cured in accordance with some embodiments (not shown). The first underfill layer 124a may be cured by a thermal curing process, an infrared (IR) energy curing process, a UV curing process, or a combination thereof.

Afterwards, a molding layer 126 is formed covering the first semiconductor die 120a and the second semiconductor die 120b as shown in FIG. 3I in accordance with some embodiments. In some embodiments, the molding layer 126 surrounds the first underfill layer 124a. In some embodiments, the molding layer 126 is a molding compound layer, including an epoxy-based resin with fillers dispersed therein. The fillers may include insulating fibers, insulating particles, other suitable elements, or a combination thereof. In some embodiments, the molding layer 126 is deposited using a molding process.

After the molding layer 126 is formed, the molding layer 126 is cured. The processes for curing the molding layer 126 may be the same as, or similar to, the curing process after forming the first underfill layer 124a. For the purpose of brevity, the descriptions of these processes are not repeated herein.

Next, a planarization process is performed on the molding layer 126, as shown in FIG. 3I in accordance with some embodiments. After the planarization process, the top surface of the first semiconductor die 120a and the second semiconductor die 120b and the top surface of the first underfill layer 124a and the molding layer 126 are exposed. Therefore, it may provide better contact to the carrier substrate subsequently formed thereon. The planarization process may include a grinding process, a chemical mechanical polishing (CMP) process, a dry polishing process, an etching process, one or more other applicable processes, or a combination thereof.

Next, a second carrier substrate 102b is bonded over the first semiconductor die 120a and the second semiconductor die 120b, as shown in FIG. 3J in accordance with some embodiments. The second carrier substrate 102b may be bonded to the first semiconductor die 120a and the second semiconductor die 120b by a buffer layer (not shown). The processes and material for forming the second carrier substrate 102b may be the same as, or similar to, those for bonding the first carrier substrate 102a. For the purpose of brevity, the descriptions of these processes are not repeated herein.

Afterwards, the first carrier substrate 102a is removed, and the structure of FIG. 3J is flipped, as shown in FIG. 3K, in accordance with some embodiments of the disclosure. As a result, the interposer 114 may face up and be exposed.

Next, second electrical connectors 122b and third electrical connectors 122c are formed under the interposer 114, as shown in FIG. 3L, in accordance with some embodiments of the disclosure. The second electrical connector 122b may be referred to as the micro-bump 122b. The processes and material for forming the second electrical connector 122b may be the same as, or similar to, those for forming the first electrical connector 122a. For the purpose of brevity, the descriptions of these processes are not repeated herein.

In some embodiments, the third electrical connectors 122c are controlled collapse chip connection (C4) bumps. The third electrical connector 122c may be made of a solder material, such as Sn, Ag, Au, or another suitable conductive material. The third electrical connector 122c may be formed by evaporation, electroplating, solder transfer, other suitable process, or a combination thereof.

As shown in FIG. 3L, some of the second electrical connector 122b and the third electrical connector 122c are electrically connected to the first die 120a, and some of the second electrical connector 122b and the third electrical connector 122c are electrically connected to the second die 120b. As shown in FIG. 3L, the third electrical connector 122c surrounds the second electrical connector 122b. As shown in FIG. 3L, the total height of the third electrical connector 122c is greater than the total height of the second electrical connector 122b.

Next, a device 128a is mounted to the interposer 114 by the second electrical connector 122b as shown in FIG. 3M, in accordance with some embodiments of the disclosure. In some embodiments, the third electrical connector 122c surrounds the device 128a. In some embodiments, the device 128a is electrically connected to the first die 120a and the second die 120b. The processes for mounting the device 128a may be the same as, or similar to, the process for mounting the first die 120a and the second die 120b. For the purpose of brevity, the descriptions of these processes are not repeated herein.

Next, a second underfill layer 124b is filled between the bottom via layer 112a of the interposer 114 and the device 128a as shown in FIG. 3N, in accordance with some embodiments of the disclosure. The processes for filling the second underfill layer 124b may be the same as, or similar to, the process for filling the first underfill layer 124a. For the purpose of brevity, the descriptions of these processes are not repeated herein.

Afterwards, the second carrier substrate 102b and the buffer layer are removed, as shown in FIG. 3O in accordance with some embodiments of the disclosure. Next, the structure of FIG. 3O is flipped and the interposer 114 is mounted to the substrate 130 by the third electrical connector 122c, as shown in FIG. 3P in accordance with some embodiments of the disclosure. As a result, the first die 120a, the second die 120b, the first underfill layer 124a, and the molding layer 126 may face up and be exposed. In some embodiments, the substrate 130 is mounted under the third electrical connector 122c.

As shown in FIG. 3P, a recess is formed in the substrate 130 under the device 128a. In some embodiments, the top surface of the substrate 130 under the device 128a is lower than the top surface of the substrate under the third electrical connector 122c. In some embodiments, the bottom surface of the device 128a is lower than the bottom surface of the third electrical connector 122c. As shown in FIG. 3P, the bottom surface of the device 128a is separate from the substrate 130.

Next, a third underfill layer 124c is filled between the bottom via layer 112a of the interposer 114 and the substrate 130 as shown in FIG. 3Q, in accordance with some embodiments of the disclosure. The processes for filling the third underfill layer 124c may be the same as, or similar to, the process for filling the first underfill layer 124a. For the purpose of brevity, the descriptions of these processes are not repeated herein. In some embodiments as shown in FIG. 3Q, the third underfill layer 124c surrounds the second underfill layer 124b. The third underfill layer 124c may be filled in the recess in the substrate.

In some embodiments as shown in FIG. 3Q, the distance D2 between the bottom via structures 108a electrically connected to the second electrical connectors 122b is shorter than the distance D3 between the bottom via structure 108a electrically connected to the third electrical connectors 122c. Therefore, the bottom via structures 108a electrically connected to the second electrical connectors 122b may suffer more strain due to coefficient of thermal expansion mismatch between the device/die and the substrate. In some embodiments as shown in FIG. 3Q, the bottom via structures 108a electrically connected to the second electrical connectors 122b and the bottom via structure 108a electrically connected the third electrical connectors 122c are in the same dielectric layer 104a.

The traces of the redistribution layer structures electrically connected to the second electrical connectors 122b may extend in different directions, and the traces of the redistribution layer structures electrically connected to the third electrical connectors 122c may extend in the same direction. In some embodiments, the traces of the redistribution layer structures electrically connected to the third electrical connectors 122c overlap each other. In some embodiments as shown in FIGS. 1-1, 1-2, 2, and 3Q, the first electrical connector 122a overlaps the second electrical connector 122b from a top view.

By forming an interposer 114 with redistribution layer structures in different via layers extending in different directions, the deformation induced by coefficient of thermal expansion mismatch between the device/die and the substrate may be reduced, and the strain transmitted to via structures may be further reduced. In addition, the position of the via structures may be optimized with more flexibility. Therefore, the stain may be further reduced, and the reliability window may also be improved. The redistribution layer structures in different via layers extending in different directions may be electrical connected to multiple dies.

Figure 4:
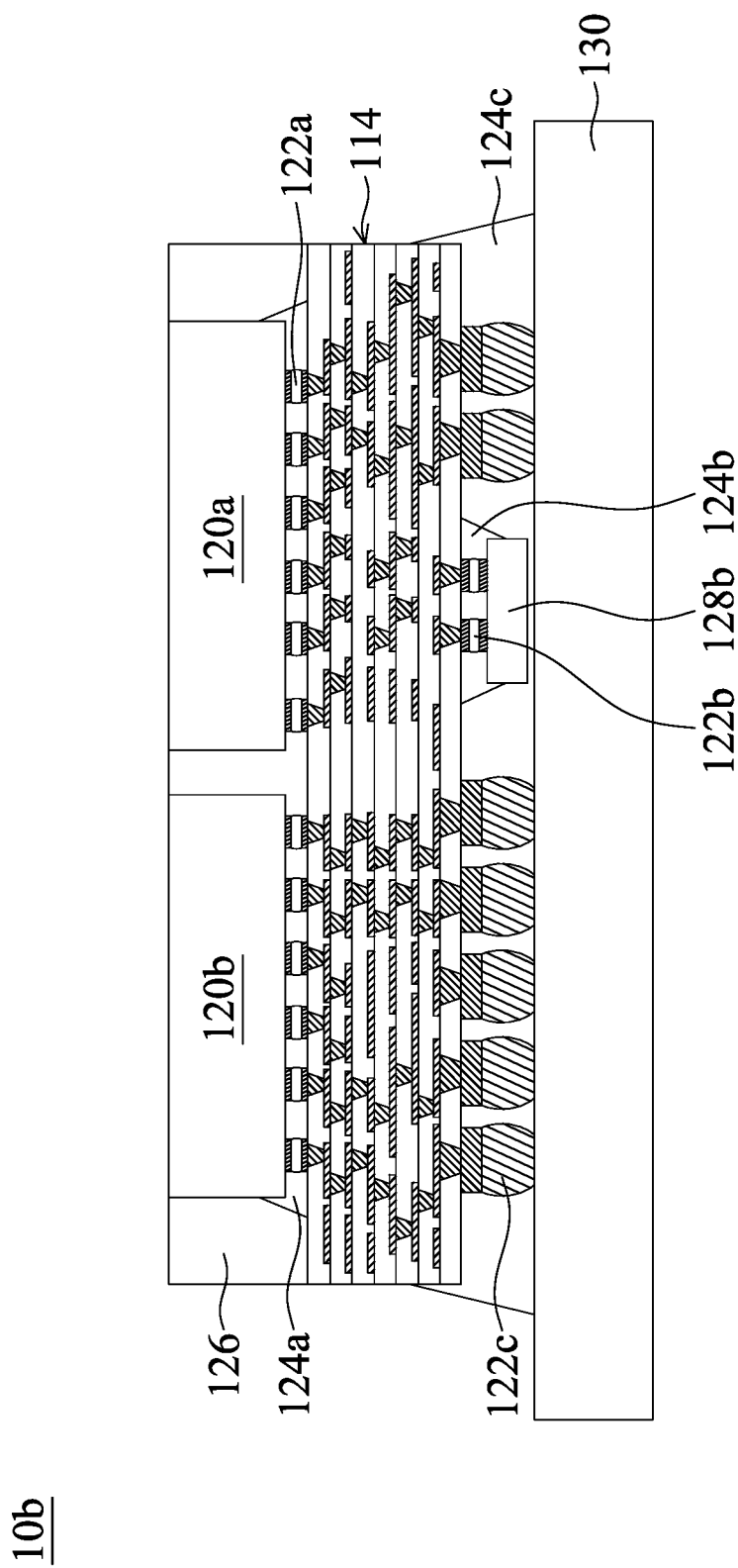
FIG. 4 is a cross-sectional view of a modified semiconductor package structure, in accordance with some embodiments of the disclosure.

Many variations and/or modifications may be made to the embodiments of the disclosure. FIG. 4 is a cross-sectional view of a modified semiconductor package structure 10b, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 4 in accordance with some embodiments, the device 128b is electrically connected to a single die 120a.

In some embodiments as shown in FIG. 4, different layers of the redistribution layer structures in the interposer 114 electrically connected to the device 128b are extending in different directions. As shown in FIG. 4, the first die 120a and the second die 120b are electrically isolated. As shown in FIG. 4, different layers of the redistribution layer structures in the interposer 114 electrically connected to the third electrical connectors 122c are extending in the same direction. In some embodiments, different layers of the redistribution layer structures in the interposer 114 electrically connected to the third electrical connectors 122c are parallel to each other.

By forming an interposer 114 with redistribution layer structures in different via layers extending in different directions, the deformation induced by coefficient of thermal expansion mismatch between the device/die and the substrate may be reduced, and the strain transmitted to via structures may be further reduced. In addition, the position of the via structures may be optimized with more flexibility. Therefore, the stain may be further reduced, and the reliability window may also be improved. The redistribution layer structures in different via layers extending in different directions may be electrical connected to a single die.

Figure 5:
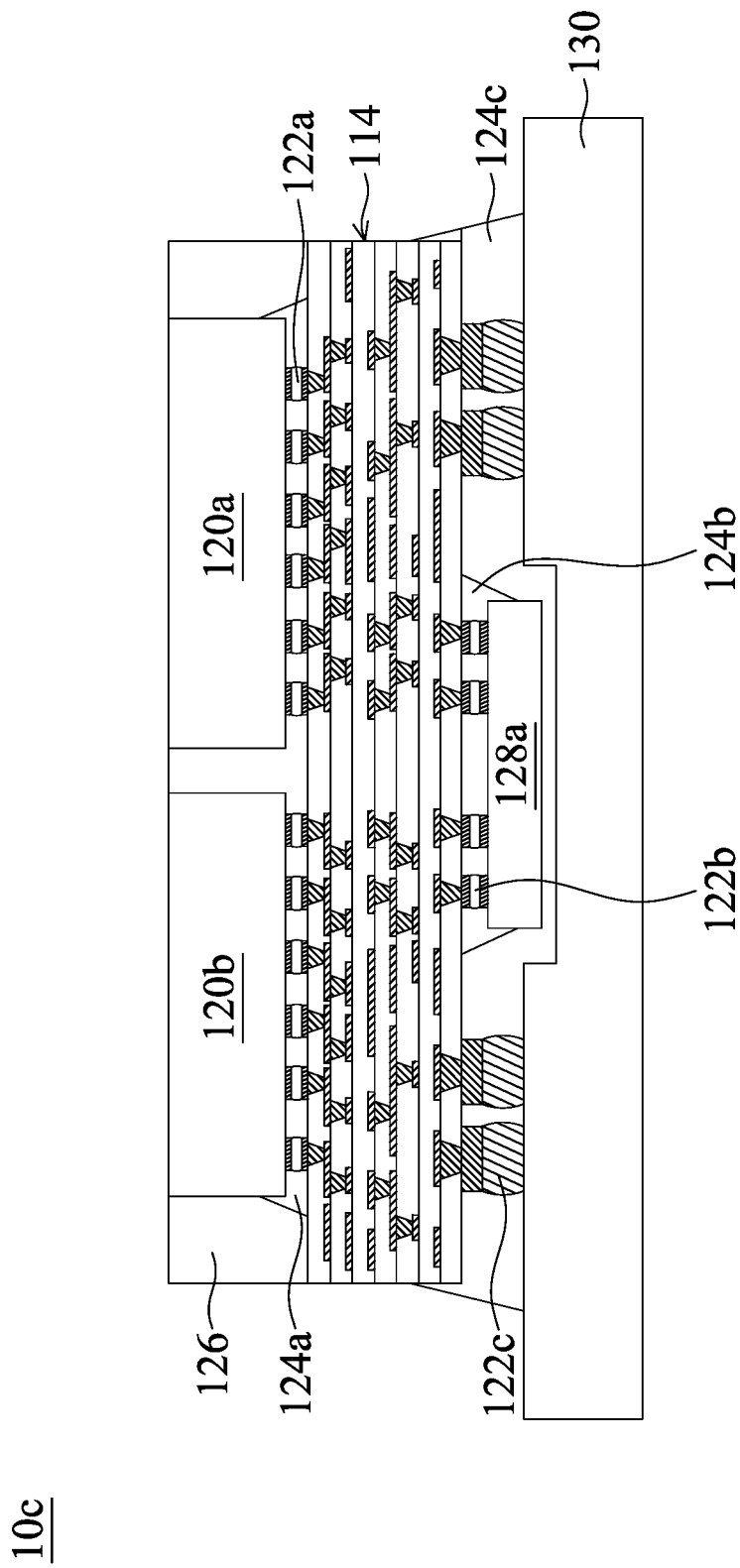
FIG. 5 is a cross-sectional view of a modified semiconductor package structure, in accordance with some embodiments of the disclosure.

Many variations and/or modifications may be made to the embodiments of the disclosure. FIG. 5 is a cross-sectional view of a modified semiconductor package structure 10c, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 5 in accordance with some embodiments, different layers of the redistribution layer structures in the interposer 114 electrically connected to the third electrical connectors 122c are extending in different directions.

As shown in FIG. 5, different layers of the redistribution layer structures in the interposer 114 electrically connected to the second electrical connectors 122b and the third electrical connectors 122c are extending in different directions. Therefore, the deformation induced by coefficient of thermal expansion mismatch between the device 128a/die 120a and the substrate 130 may be further reduced.

By forming an interposer 114 with redistribution layer structures in different via layers extending in different directions, the deformation induced by coefficient of thermal expansion mismatch between the device/die and the substrate may be reduced, and the strain transmitted to via structures may be further reduced. In addition, the position of the via structures may be optimized with more flexibility. Therefore, the stain may be further reduced, and the reliability window may also be improved. The redistribution layer structures in different via layers electrical connecting to the bottom electrical connector over the substrate may be also extending in different directions, which may further reduce the stain.

Figure 6:
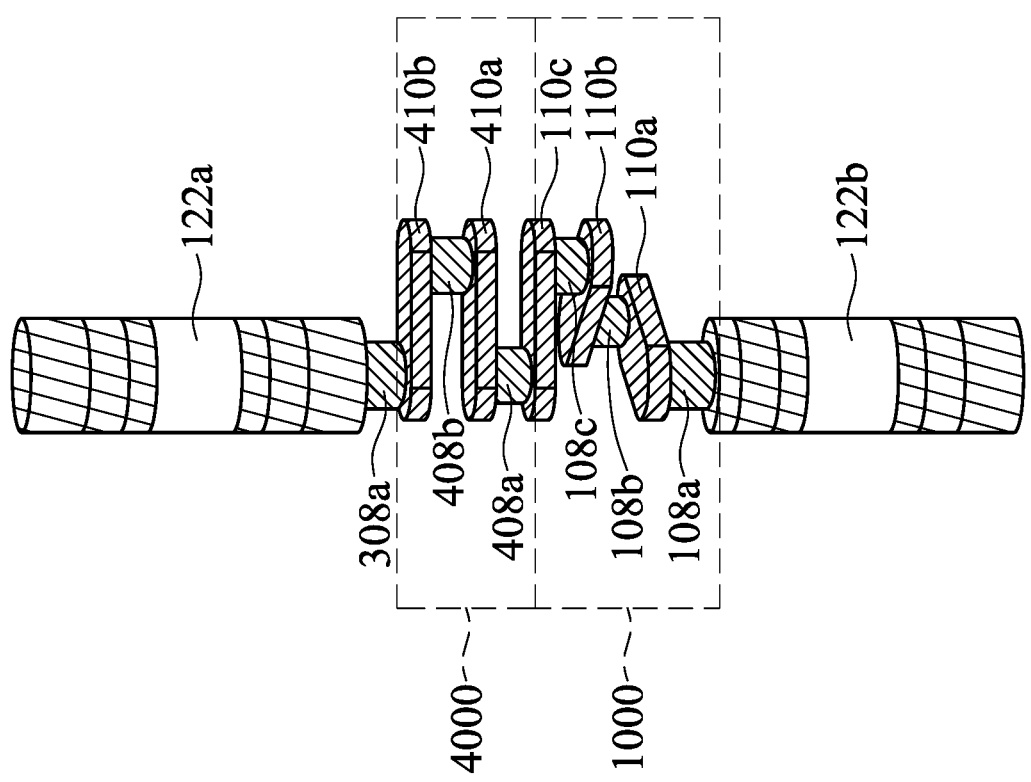
FIG. 6 is an enlarged perspective view of a modified semiconductor package structure, in accordance with some embodiments of the disclosure.

Many variations and/or modifications may be made to the embodiments of the disclosure. FIG. 6 is an enlarged perspective view of a modified semiconductor package structure, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 6 in accordance with some embodiments, some of the traces of the redistribution layer structures in different layers in conductive unit 1000 are extending in different directions, while some of the traces of the redistribution layer structures in different layers in conductive unit 4000 are extending in the same direction.

In some embodiments as shown in FIG. 6, the traces of the redistribution layer structures 110a, 110b, and 110c are extending in different directions, and the traces of the redistribution layer structures 410a and 410b are extending in the same direction.

It should be noted that although the traces of the redistribution layer structures 410a and 410b in the conductive unit 4000 extending in the same direction are arranged over the traces of the redistribution layer structures 110a, 110b, and 110c in the conductive unit 1000 extending in different directions, the present disclosure is not limited thereto. The traces of the redistribution layer structures may be arranged in different ways, depending on the demands of the application. In addition, it should be noted that the number of the traces of the redistribution layer structures extending in the same direction and the number of the traces of the redistribution layer structures extending in different directions are merely an example, and the present disclosure is not limited thereto, depending on the demands of the application.

By forming an interposer 114 with redistribution layer structures in different via layers extending in different directions, the deformation induced by coefficient of thermal expansion mismatch between the device/die and the substrate may be reduced, and the strain transmitted to via structures may be further reduced. In addition, the position of the via structures may be optimized with more flexibility. Therefore, the stain may be further reduced, and the reliability window may also be improved. Some of the redistribution layer structures in different via layers may be extended in different directions, while others of the redistribution layer structures in different via layers may be extended in the same direction, depending on the demand of the application.

Figure 7:
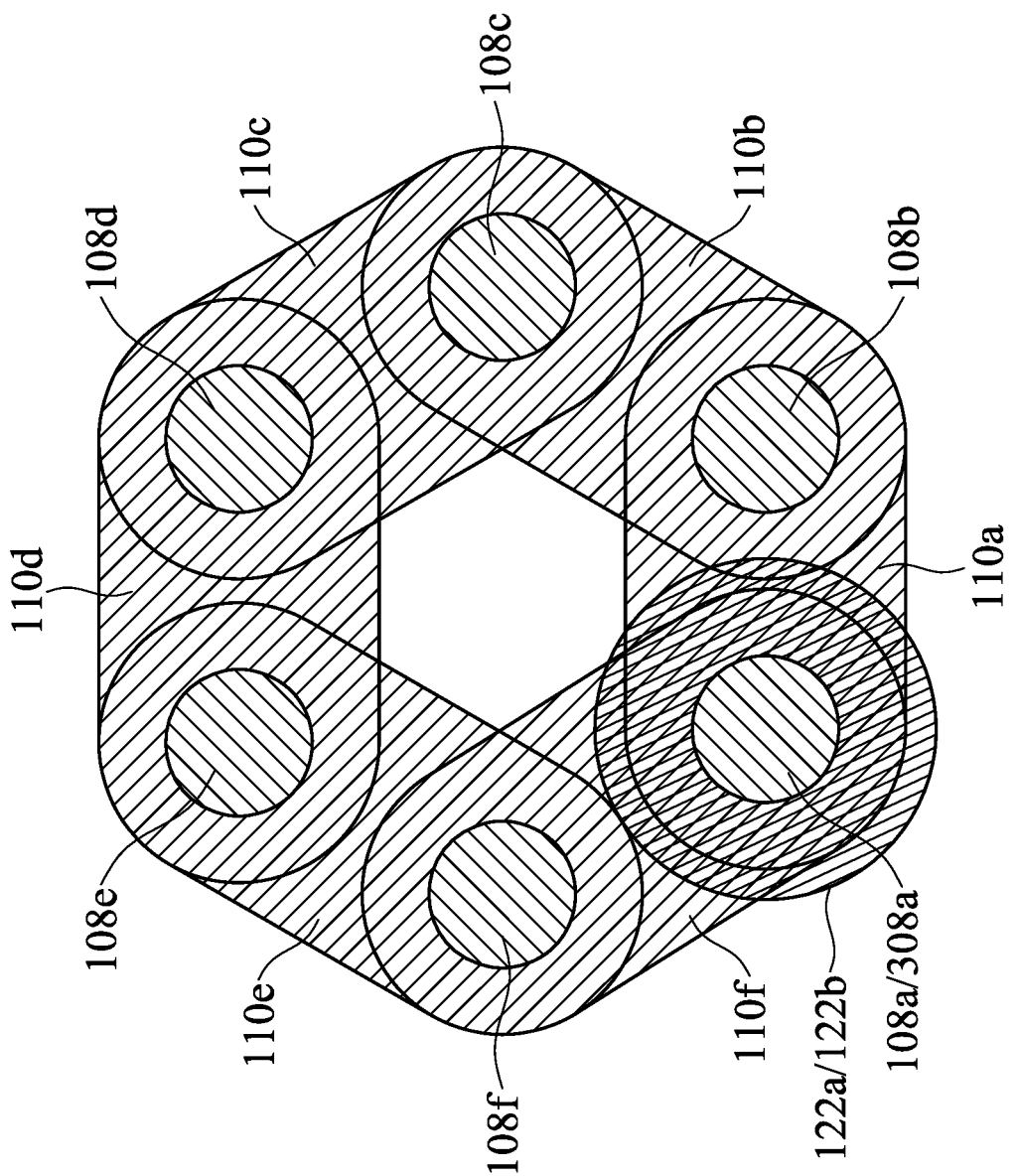
FIG. 7 is an enlarged top view of a modified semiconductor package structure, in accordance with some embodiments of the disclosure.
Figure 8:
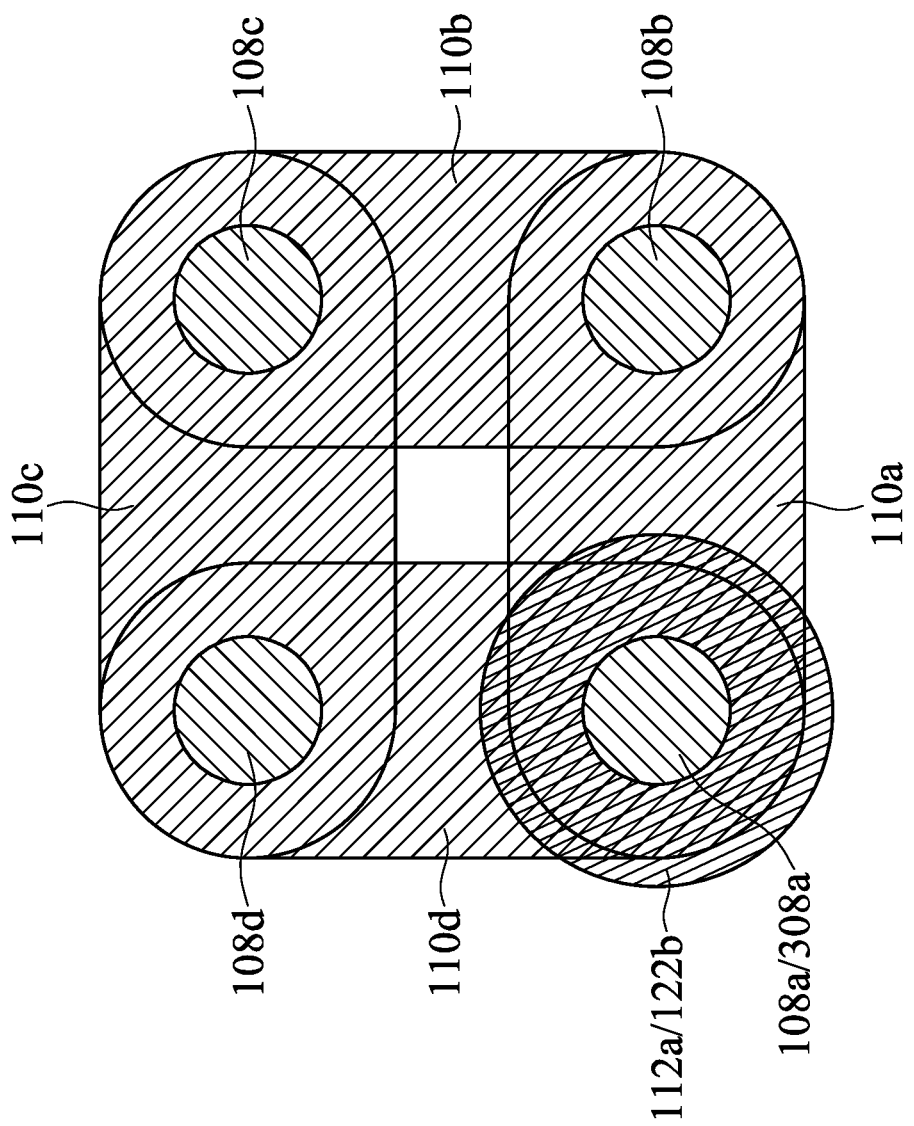
FIG. 8 is an enlarged top view of a modified semiconductor package structure, in accordance with some embodiments of the disclosure.

Many variations and/or modifications may be made to the embodiments of the disclosure. FIGS. 7 and 8 are top views of a modified semiconductor package structure, in accordance with some embodiments of the disclosure. Some processes or devices are the same as, or similar to, those described in the embodiments above, and therefore the descriptions of these processes and devices are not repeated herein. The difference from the embodiments described above is that, as shown in FIGS. 7 and 8 in accordance with some embodiments, the traces of the redistribution layer structures in different via layers are arranged in the shape of a polygon.

As shown in FIG. 7, the traces of the redistribution layer structures 110a, 110b, 110c, 110d, 110e, and 110f connecting the via structures 108a/308a, 108b, 108c, 108d, 108e, and 108f are arranged in the shape of a hexagon. In some embodiments as shown in FIG. 7, the angle between adjacent traces of redistribution layer structures is about 120°. As shown in FIG. 8, the traces of the redistribution layer structures 110a, 110b, 110c, and 110d connecting the via structures 108a/308a, 108b, 108c, and 108d are arranged in the shape of a square. In some embodiments as shown in FIG. 8, the angle between adjacent traces of redistribution layer structures is about 90°.

By forming an interposer 114 with redistribution layer structures in different via layers extending in different directions, the deformation induced by coefficient of thermal expansion mismatch between the device/die and the substrate may be reduced, and the strain transmitted to via structures may be further reduced. In addition, the position of the via structures may be optimized with more flexibility. Therefore, the stain may be further reduced, and the reliability window may also be improved. The traces of the redistribution layer structures in different via layers may be arranged in the shape of a polygon, such as a triangle, a hexagon, or a square.

As described previously, arranging traces of redistribution layer structures in different via layers extending in different directions may reduce the strain induced by the coefficient of thermal expansion mismatch between the device/die and the substrate. With traces of redistribution layer structures extending in different directions, there may be more flexibility and the reliability window may be improved. Multiple dies may be electrical connected with each other by the traces of redistribution layer structures extending in different directions. In the embodiments illustrated in FIG. 4, the traces of redistribution layer structures extending in different directions are mounted to a single die and a single device by micro-bumps. In the embodiments illustrated in FIG. 5, the traces of redistribution layer structures extending in different directions are mounted to micro-bumps or controlled collapse chip connection bumps. In the embodiments illustrated in FIG. 6, some of the traces of redistribution layer structures in different via layers are extending in different directions, while some of the traces of redistribution layer structures in different via layers are extending in the same direction. In the embodiments illustrated in FIGS. 2, 7 and 8, the traces of redistribution layer structures are arranged in polygons.

Embodiments of a semiconductor package structure and a method for forming the same are provided. The semiconductor package structure includes traces of redistribution layer structures in different via layers extending in different directions. The coefficient of thermal expansion mismatch between the device/die and the substrate may be reduced, and the strain transmitted to via structures may be further reduced. With more flexibility of redistribution layer structures arrangement, the reliability window may be also improved.

In some embodiments, a semiconductor package structure is provided. The semiconductor package structure includes a first bottom electrical connector. The semiconductor package structure also includes an interposer formed over the first bottom electrical connector. The interposer includes first bottom via structures in contact with the first bottom electrical connector. The interposer also includes a first trace of a first redistribution layer structure formed over the first bottom via structures. The interposer also includes first via structures formed over the first trace of the first redistribution layer. The interposer also includes a first trace of a second redistribution layer structure formed over the first via structures. The interposer also includes second via structures formed over the first trace of the second redistribution layer structure. The first bottom via structures, the first via structures, and the second via structures are separated from each other in a top view.

In some embodiments, a semiconductor package structure is provided. The semiconductor package structure includes bottom electrical connectors formed over a substrate. The semiconductor package structure also includes at least two conductive units formed over the bottom electrical connectors. Each of the conductive units includes a bottom via layer, a first redistribution layer structure, a first middle via layer, and a second redistribution layer structure. The bottom via layer is formed over the bottom electrical connectors. The first redistribution layer structure includes a first trace formed over the bottom via layer. The first middle via layer is formed over the first redistribution layer structure. The second redistribution layer structure includes a second trace formed over the first middle via layer. The semiconductor package structure also includes a top via layer formed over the conductive units. The semiconductor package structure also includes top electrical connectors formed over the top via layer. The semiconductor package structure also includes a first die formed over the top electrical connectors. An extending direction of the first trace of the first redistribution layer structure is different from an extending direction of the second trace of the second redistribution layer structure.

In some embodiments, a method for forming a semiconductor package structure is provided. The method for forming a semiconductor package structure includes forming bottom electrical connectors over a substrate. The method for forming a semiconductor package structure also includes forming a bottom via layer over the bottom electrical connector. The method for forming a semiconductor package structure also includes depositing a first redistribution layer structure comprising a first trace over the bottom via layer. The method for forming a semiconductor package structure also includes forming a first middle via layer over the first redistribution layer structure. The method for forming a semiconductor package structure also includes depositing a second redistribution layer structure comprising a second trace over the first middle via layer. The method for forming a semiconductor package structure also includes forming a second middle via over the second redistribution layer structure. The method for forming a semiconductor package structure also includes depositing a third redistribution layer structure comprising a third trace over the second middle via layer. The method for forming a semiconductor package structure also includes forming a top via layer over the third redistribution layer structure. The method for forming a semiconductor package structure also includes forming top electrical connectors over the top via layer. The first trace of the first redistribution layer structure, the second trace of the second redistribution layer structure, and the third trace of the third redistribution layer structure extend in different directions in a top view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package structure, comprising:
   a first bottom electrical connector; and
   an interposer formed over the first bottom electrical connector, wherein the interposer comprises:
   first bottom via structures in contact with the first bottom electrical connector;
   a first trace of a first redistribution layer structure formed over the first bottom via structures;
   first via structures formed over the first trace of the first redistribution layer structure;
   a first trace of a second redistribution layer structure formed over the first via structures;
   second via structures formed over the first trace of the second redistribution layer structure;
   a first trace of a third redistribution layer structure formed over the second via structures; and
   third via structures formed over the first trace of the third redistribution layer structure,
   wherein the first bottom via structures, the first via structures, and the second via structures are separated from each other in a top view, and
   wherein one of the third via structures vertically overlaps a portion of a dielectric layer, and the portion of the dielectric layer vertically overlaps one of the first bottom via structures and has a thickness greater than a sum of a thickness of one of the first via structures and a thickness of one of the second via structures.

2. The semiconductor package structure as claimed in claim 1, further comprising:
   a first trace of a fourth redistribution layer structure formed over the third via structures.

3. The semiconductor package structure as claimed in claim 2, wherein an extending direction of the first trace of the first redistribution layer structure and an extending direction of the first trace of the fourth redistribution layer structure are substantially the same.

4. The semiconductor package structure as claimed in claim 2, wherein an extending direction of the first trace of the third redistribution layer structure and an extending direction of the first trace of the fourth redistribution layer structure are substantially the same.

5. The semiconductor package structure as claimed in claim 2, wherein the first trace of the first redistribution layer structure, the first trace of the second redistribution layer structure, the first trace of the third redistribution layer structure, and the first trace of the fourth redistribution layer structure are arranged in a shape of rectangle from the top view.

6. The semiconductor package structure as claimed in claim 1, further comprising:
- a first top electrical connector formed over the second via structures;
- a device mounted under the first bottom electrical connector;
- a die mounted over the first top electrical connector;
- a second bottom electrical connector mounted under the interposer; and
- a substrate mounted under the second bottom electrical connector.

7. The semiconductor package structure as claimed in claim 6, wherein a bottom surface of the device is lower than a bottom surface of the second bottom electrical connector.

8. The semiconductor package structure as claimed in claim 6, wherein the interposer further comprises:
- second bottom via structures in contact with the second bottom electrical connector;
- a second trace of the first redistribution layer structure over the second bottom via structures;
- second via structures over the second trace of the first redistribution layer structure;
- a second trace of the second redistribution layer structure over the second via structures;
- second top via structures over the second trace of the second redistribution layer structure and in contact with the first top electrical connector,
- wherein the second trace of the first redistribution layer structure overlaps the second trace of the second redistribution layer structure from a top view.

9. A semiconductor package structure, comprising:
- bottom electrical connectors formed over a substrate;
- a first conductive unit formed over the bottom electrical connectors, wherein the first conductive unit comprises:
  - a first bottom via layer;
  - a first redistribution layer structure comprising a first trace formed over the first bottom via layer;
  - a first middle via layer formed over the first redistribution layer structure; and
  - a second redistribution layer structure comprising a second trace formed over the first middle via layer;
- a first dielectric layer vertically overlapping the first bottom via layer; and
- a second conductive unit formed over the first dielectric layer, wherein the second conductive unit comprises:
  - a second bottom via layer;
  - a second dielectric layer vertically overlapping the first bottom via layer and the first dielectric layer, wherein a thickness of the first dielectric layer is greater than a thickness of the second dielectric layer;
  - a top via layer formed over the second conductive unit;
  - top electrical connectors formed over the top via layer; and
  - a first die formed over the top electrical connectors,
- wherein an extending direction of the first trace of the first redistribution layer structure is different from an extending direction of the second trace of the second redistribution layer structure.

10. The semiconductor package structure as claimed in claim 9, further comprising:
- a device mounted under the bottom electrical connectors; and
- a second die mounted over the top electrical connectors, wherein the device is electrically connected to the first die and the second die.

11. The semiconductor package structure as claimed in claim 8, wherein an angle between an extending direction of the first trace of the first redistribution layer structure and an extending direction of the second trace of the second redistribution layer structure is in a range of about 30° to about 150°.

12. The semiconductor package structure as claimed in claim 8, wherein the bottom via layer comprises a bottom via structure in a bottom dielectric layer, the first middle via layer comprises a first middle via structure in a first middle dielectric layer, and the top via layer comprises a top via structure in a top dielectric layer.

13. The semiconductor package structure as claimed in claim 12, wherein a distance between a center of the bottom via structure and a center the first middle via structure is greater than about 3 μm.

14. A method for forming a semiconductor package structure, comprising:
- forming bottom electrical connectors over a substrate;
- forming a bottom via layer over the bottom electrical connector;
- depositing a first redistribution layer structure comprising a first trace over the bottom via layer;
- forming a first middle via layer over the first redistribution layer structure;
- depositing a second redistribution layer structure comprising a second trace over the first middle via layer;
- forming a second middle via layer over the second redistribution layer structure;
- depositing a third redistribution layer structure comprising a third trace over the second middle via layer;
- forming a top via layer over the third redistribution layer structure;
- forming top electrical connectors over the top via layer,
- wherein the first trace of the first redistribution layer structure, the second trace of the second redistribution layer structure, and the third trace of the third redistribution layer structure extend in different directions in a top view, and
- wherein the first trace of the first redistribution layer structure, the second trace of the second redistribution layer structure, and the third trace of the third redistribution layer structure are arranged in a triangular shape in the top view.

15. The method for forming the semiconductor package structure as claimed in claim 14, wherein the bottom electrical connectors overlap the top electrical connectors from the top view.

16. The method for forming the semiconductor package structure as claimed in claim 14, further comprising:
- jointing a first die over the top via layer;
- bonding a second carrier substrate over the first die;
- flipping the first die and debonding the first carrier substrate; and
- debonding the second carrier substrate.

17. The method for forming the semiconductor package structure as claimed in claim 16, further comprising:
- filling a first underfill layer between the top via layer and the first die;
- jointing a device under the bottom via layer;
- filling a second underfill layer between the bottom via layer and the device;
- jointing a substrate under the bottom via layer; and
- filling a third underfill layer between the bottom via layer and the substrate,
- wherein the third underfill layer surrounds the second underfill layer.

18. The method for forming the semiconductor package structure as claimed in claim 16, further comprising:
jointing a second die over the top via layer,
wherein the first die and the second die are different.

19. The method for forming the semiconductor package structure as claimed in claim 14, wherein the first redistribution layer structure and the second redistribution layer structure are separated by a dielectric layer in a cross-sectional view.

20. The method for forming the semiconductor package structure as claimed in claim 19, wherein an angle between an extending direction of the first trace of the first redistribution layer structure and an extending direction of the second trace of the second redistribution layer structure is about 30°.

* * * * *